United States Patent [19]
Hoffmann

[11] 4,318,188
[45] Mar. 2, 1982

[54] SEMICONDUCTOR DEVICE FOR THE REPRODUCTION OF ACOUSTIC SIGNALS

[75] Inventor: Kurt Hoffmann, Taufkirchen, Fed. Rep. of Germany

[73] Assignee: Siemens Aktiengesellschaft, Berlin & Munich, Fed. Rep. of Germany

[21] Appl. No.: 40,527

[22] Filed: May 21, 1979

[30] Foreign Application Priority Data

Jun. 19, 1978 [DE] Fed. Rep. of Germany ....... 2826870

[51] Int. Cl.³ .............................................. G11C 13/00
[52] U.S. Cl. ...................................... 365/45; 360/32; 179/1 SM; 340/347 AD
[58] Field of Search .......................... 360/32; 365/45; 179/1 SM, 1 SA; 340/347 AD, 347 DA

[56] References Cited
U.S. PATENT DOCUMENTS 3,102,165  8/1963  Clapper ......................... 179/1 SM
3,772,681  11/1973  Skingle ........................ 340/347 DA
4,024,512  5/1977  Amelio et al. ...................... 365/235

OTHER PUBLICATIONS

"Improving Recorded Announcement Service With Magnetic Bubbles", by Ronald D. Trupp, Bell Lab Record, vol. 55, No. 9, Oct. 1977, pp. 249–252.

Primary Examiner—Terrell W. Fears
Attorney, Agent, or Firm—Hill, Van Santen, Steadman, Chiara & Simpson

[57] ABSTRACT

A microphone, for receiving an acoustic signal, is connected to a transducer which changes the analog signal delivered by the microphone into a sufficiently dense series of storable pulses in such a manner that the series contains the information necessary for the reproduction of the analog signal. The pulses delivered by the transducer can be pulse amplitude modulated (PAM) signals. The transducer must be connected to an analog memory. In the case where the signals are digital, such as pulse code modulated (PCM) signals, a digital memory is used. For reproduction, the pulses recalled from memory, in the first case, are fed via a low pass filter to an amplifier and a loud speaker. In the second case, the pulses are first converted into an analog form in a digital/analog converter. Stacked-gate injection metal-oxide-semiconductor (SIMOS) memories may be considered as the analog memories and, as digital memories, electrically alterable read-only memories (EAROM) may be utilized.

10 Claims, 12 Drawing Figures

SEMICONDUCTOR DEVICE FOR THE REPRODUCTION OF ACOUSTIC SIGNALS

BACKGROUND OF THE INVENTION

1. Field of the Invention

The present invention is concerned with a semi-conductor device for reproducing acoustic signals.

2. Description of the Prior Art

In order to reproduce acoustic signals it is customary to employ magnetic tape recorders. Magnetic tape recorders, however, are not cost efficient when one is concerned with the reproduction of short language traces.

SUMMARY OF THE INVENTION

It is therefore the object of the present invention to provide a device, constructed in semiconductor technology, with the exception of perhaps the microphone and the loud speaker, which can be constructed on a single semiconductor chip.

According to the present invention, a microphone for receiving an acoustic signal is connected to a transducer which is responsive to generate a series of discrete electrical pulses which represent the information contained in the electrical signal produced by the microphone. The transducer may be connected to the data input of a semiconductor read-write memory which stores the information contained in the pulse series.

In order to reproduce the acoustic signal, the memory is used in a reverse mode as an information source, and the information stored therein is used for reproducing the series of discrete electrical pulses originally obtained from the acoustic signal. These pulses are then drawn upon, either directly or by way of a corresponding transducer which produces an electrical signal analogous to the original acoustic signal from the series of pulses, for the regeneration of the acoustic signal.

As a result of the foregoing, the following possibilities arise:

(a) The electrical analog signal provided by the microphone is transferred via an analog/digital transducer into a series of binary digital pulses, and is maintained in a corresponding write-read memory, that is, in a semiconductor digital memory. For playback then, the semiconductor digital memory is connected with a digital/analog transducer, which then again generates a signal analogous to the microphone signal from the series of binary digital pulses emitted by the memory, which signal then reciprocally, and after corresponding amplification, is used for controlling a playback device, such as a loud speaker.

(b) The electrical analog signal supplied by the microphone is decomposed by means of a pulse amplitude modulation (PAM) procedure or a procedure which functions in a manner similar thereto into a series of discrete pulses for which the original analog signal forms a sort of envelope, so that the amplitude of the individual pulses, in general, have different values. The pulse series obtained in this manner is fed into a semiconductor memory. During playback, by readout of the memory, the pulse series read into the memory is recreated and is used for the reproduction of the acoustic signal.

As a memory, it is preferable to utilize nonvolatile, fixed semiconductor memories, in which the stored information is preserved after disconnection of the supply voltage.

Dictation playback devices of the type mentioned above are possible because, corresponding to the so-called sampling theorum, as described, for example, by Philip F. Panther "*Modulation, Noise and Spectral Analysis*", McGraw-Hill Book Company, pp. 506, 507 and Philip's Techn. Rundschau 36 No. 11/12 (1976/77), pp. 352-365 (particularly page 354), discrete amplitude values of an analog signal suffice for the reproduction of the analog signal, if the speech signal which is limited in its band width $f_m$ is sampled in a sampling time base $T_o$ for the detection of the amplitude values and the sampling time base satisfies the condition $$T_o = \tfrac{1}{2} f_m$$

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
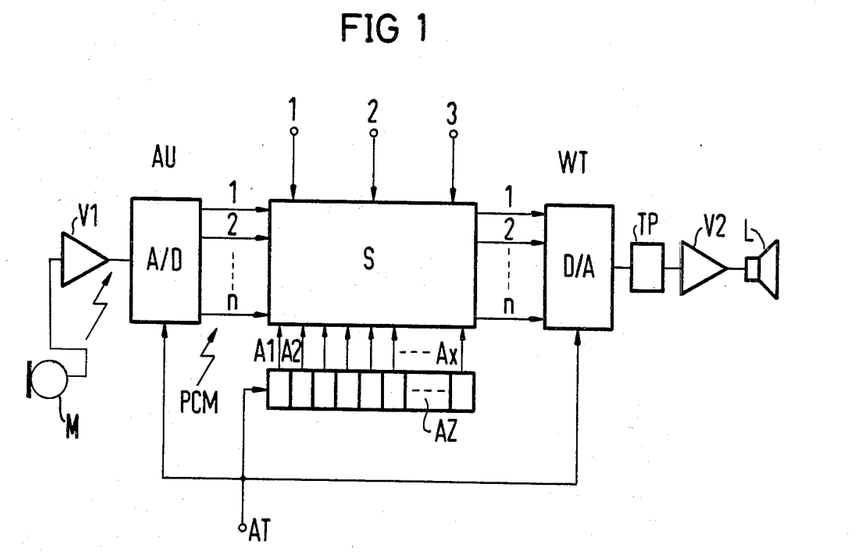
FIG. 1 is an exemplary block diagram of a simple form of execution of the present invention.

In the embodiment of the invention according to FIG. 1, as a semiconductor memory S, an EAROM semiconductor memory is provided, which on one side thereof is connectible, or permanently connected, with a receiving portion AU, and on the other side thereof, with a playback portion WT.

The input portion AU comprises a microphone M, which generates an electrical signal which is analogous to the acoustic signal to be recorded and delivers the electrical signal to a preamplifier V1. The output of the preamplifier V1 is connected to the signal input of the analog/digital converter A/D, the outputs of which are connected to the EAROM memory S. Reciprocally, the data outputs of the EAROM memory S are connected to the data inputs of a digital/analog memory D/A of the playback portion WT, at the signal output of which an analog signal appears, which, for its correction and for freeing the same of harmonic waves which have arisen, is directed through a low pass filter TP and finally across an output amplifier V2 which is connected to a loud speaker L.

EAROM memories and similar semiconductor memories are described in the literature, for example, of R. Müller et al, "Electrically Alterable 8192 Bit N-Channel MOS PROM" in the Digest Technical Papers, ISSCC 1977, pp. 188-189. The memory consists essentially of one-transistor MOS memory cells having a control gate and a so-called floating gate, the latter of which is arranged between a source and a drain at the semiconductor surface within the $SiO_2$ or similar anorganic insulating layer, which covers the semiconductor surface and which bears the control gate, and which obtains the memory loading allotted thereto through electrostatic induction and the tunnel effect, through the programming of the memory. In this manner, the memory obtains a capacity of storing the information programmed-in in a non-volatile manner. On the other hand, the individual EAROM cells are erasable when the electrical load programmed into the floating gates is obliterated through special measures, by means of which the restoration capability of the memory is not taken into account. The erasing proceeds along paths similar to those concerned with programming, as is well known to those skilled in the art.

An analog/digital converter A/D contains an input stage which functions as a chopper which has the take of decomposing the analog signal appearing at the input of the converter A/D into discrete pulses. The remainder of the analog/digital converter A/D has the task of interpreting the pulses delivered by the chopper digitally, according to the measure of the amplitude of the specific individual pulse, and of delivery in a number of binary digital pulses corresponding to this amplitude, which pulses are then used as an input for the memory S.

Analog/digital transducers of the type mentioned above are known in bipolar semiconductor technology, as well as in MOS technology, and, for example, are described in ISSCC 78, Feb. 16, 1978, Session XI, Digest of Technical Papers, pp. 131-139. It is here a matter of the arrangements customary for the so-called pulse code modulation (PCM), the construction of which secures the reproducibility of the analog signal (the sampling theorem).

For the evaluation of information which is stored in the memory S and which is sufficient for the complete restoration of the acoustic signal received by the microphone M, preferably a digital/analog converter D/A is used in the playback portion WT, as can be deduced from the portion of the literature mentioned above.

The task of the analog/digital transducer A/D is, first of all, to accept the applied analog signal from the amplifier V1, and through sufficiently frequent periodic interruption and reconnection, to generate a sufficiently dense series of electrical individual pulses (that is, corresponding to the Nyquist theorem) which in the voltage-time diagram have the original analog signal as an envelope. Suitable circuits for this purpose are, for example, also the input stages of bucket chain devices (BCD) systems or, more generally, of charge transport device (CTD) systems, which can therefore form the input, also of an analog/digital transducer which is suited for the receiving portion AT.

Connected downstream is the actual analog/digital transducer, which has the task of interpreting the amplitudes of the individual pulses which are derived from the analog signal, binary-digitally, in the sequence of their appearance, and to furnish the series of pulses which express the result of the interpretation to the EAROM memory S. The digital interpretation can proceed, as is well known in the art, in different manners, for example, according to the sawtooth procedure or according to the binary slope procedure.

The series of digital pulses recalled from the memory S on the playback portion WT are translated again into the analog form in the digital/analog transducer D/A, for example, by means of a weightable code. The subsequently-connected low pass filter has the task of repressing the appearance of interfering harmonic waves in the analog signal to be yielded at the loud speaker L.

Therefore, the following procedure results for an arrangement according to FIG. 1 where, on the receiving side AT of the semiconductor device, the analog signal controls the analog/digital transducer A/D, which at its output makes available a PCM signal having n bits. The EAROM memory S has three modes, namely:
 1. Intake, which corresponds to writing;
 2. Playback, which corresponds to reading of the EAROM; and
 3. Erasing.

The EAROM memory S is accessed by way of an address counter AZ, which is triggered by the same cycle operation (timing pulse) AT which also causes the sampling of the analog signal on the input side AU and of the digital/analog transducer D/A on the playback side WT. A cycle operation generator is not portrayed on the drawing, since the same is a matter of a generator of customary construction which delivers a rectangular pulse. The cycle operation generator on the input side AU can be identical with the cycle operation generator on the playback side WT.

Figure 2:
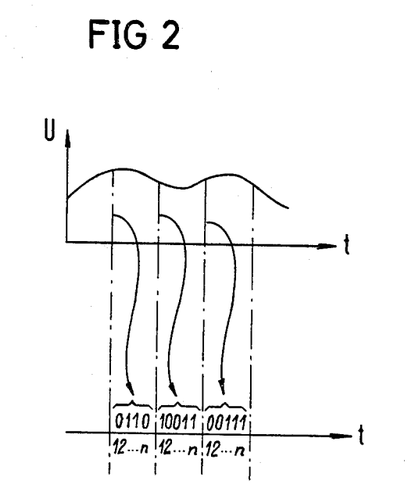
FIG. 2 is a graphic illustration of a signal at the input of the analog/digital converter of FIG. 1 and the signal appearing at the output of the converter.

In FIG. 2, two diagrams are illustrated. The upper diagram illustrates an example for the course of the pending analog signal at the input of the analog/digital transducer A/D in the input portion AU, whereas below, the digital interpretation of three amplitude values is portrayed, which appears in the form of binary pulses at the output of the analog/digital transducer A/D.

Figure 3:
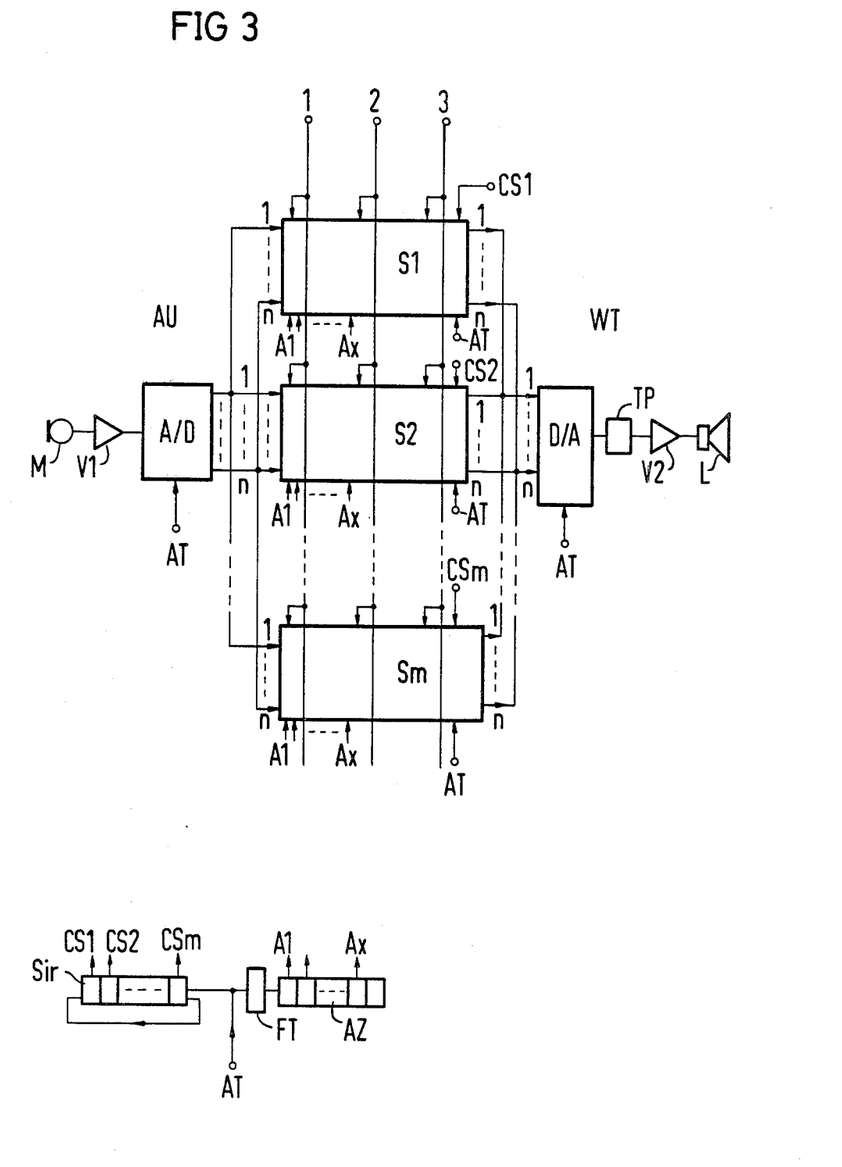
FIGS. 3 and 4 illustrate, in block diagram form, additional details of the embodiment of the invention illustrated in FIG. 1.

A further and more detailed device constructed in accordance with the present invention is illustrated in FIG. 3. Here, once again the microphone M is illustrated, as well as a preamplifier V1 and an analog/digital transducer A/D in the input portion. In the playback portion WT, in a manner analogous to FIG. 1, the digital/analog transducer D/A is provided, the signal output of which controls the loud speaker L by way of a low pass filter TP and an output amplifier V2. However, the development of the semiconductor memory takes into account the fact that frequently a single memory is insufficient.

Therefore, in the embodiment illustrated in FIG. 3, several EAROM's S1, S2, S3, Sm are connected to one another in parallel and to the output of the analog/digital transducer A/D in the input portion AU and to the input of the digital/analog transducer D/A in the playback portion WT. Besides this, and in addition to the address counter AZ, two additional circuit portions are provided.

In addition to the address counter, which is responsible for the addressing of the individual memory locations within the individual memories S1, S2, ... Sm, the counts which are applied to the individual addressing inputs A1, A2, ... Ax of the memories S1, S2, ... Sm, a frequency divider 1:m is provided, by way of which the sampling timing pulse AT is fed to the address counter AZ. Furthermore, there is also a device Sir, which makes sure that always only one of the memories S1, S2, ... Sm is effectively connected at the analog/signal transducer A/D or the digital/analog transducer D/A. This device is provided by a shaft register Sir, on the individual outputs of which pulses CS1, CS2, ... CSm appear, which are assigned to each one of the EAROM's memories S1, ... Sm, and which assure that only that memory for which the signal of the shift register Sir generated last is responsible and is connected actively onto the input side Au or the playback side WT. The frequency divider is designated FT.

The shift register Sir is connected by way of the same timing pulse AT as the other portions of the arrangement, if one disregards the address counter AZ. The selection pulses CS1, CS2, . . . CSm output by the shift register Sir arrive at the corresponding control inputs of the EAROM memories S1, S2, . . . Sm. The latter are also instructed that for their addressing, in addition to the signals A1, A2, . . . Ax emitted by the address counter AZ, also the selection signal from the shift register Sir associated therewith at each time must be affixed so that the pertaining EAROM memory S1 or S2 or . . . Sm can react to the signals emitted by the analog/digital transducer or, on its part, can release signals to the digital/analog transducer D/A.

Figure 4:
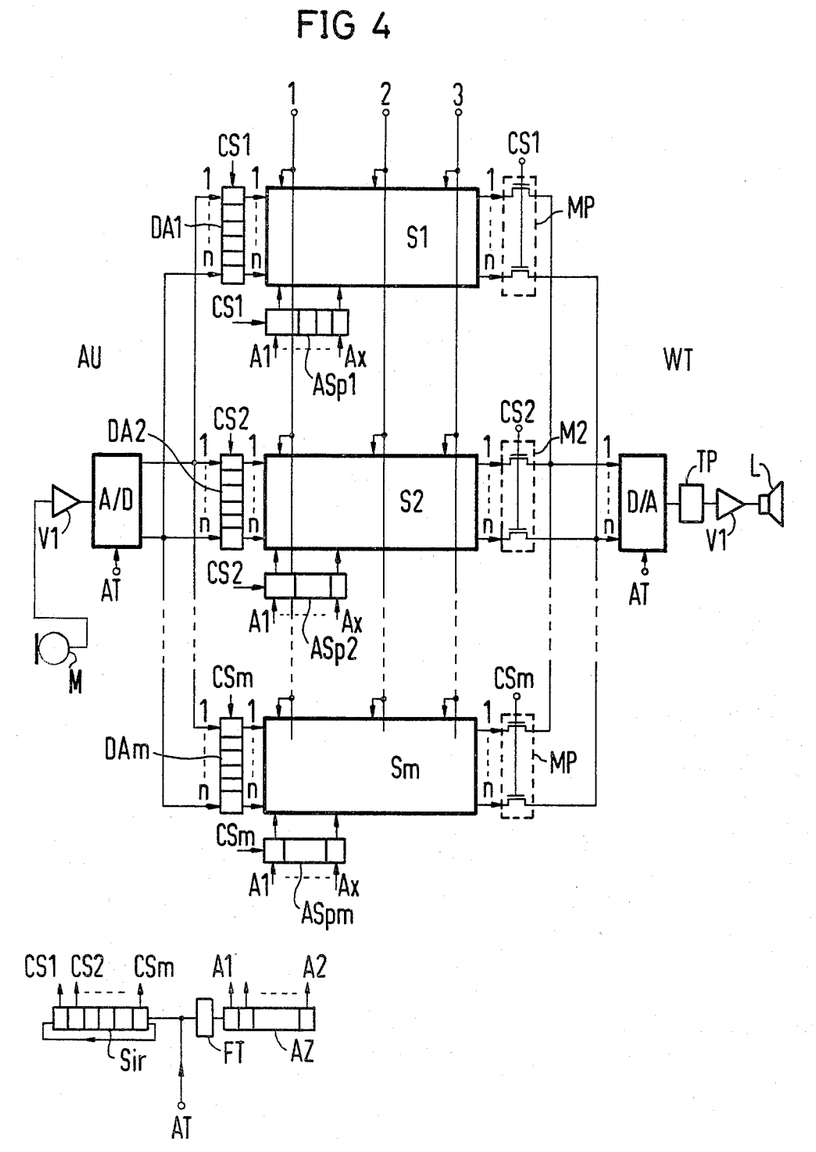

A further and more detailed embodiment of the invention of FIG. 3 is illustrated in FIG. 4. Here, to each of the EAROM memories S1, S2, . . . Sm, a data synchronizer DA1 or DA2 or . . . DAm is associated, which become active upon the selection signal CS1 or CS2 or . . . CSm associated to the appertaining EAROM memory, and then react upon the signals released from the analog/digital transducer A/D of the input portion AU, receive the same and then pass the same on at the EAROM memory S1–Sm which, in each case, appertains thereto. The memory selection signals CS1 . . . CSm arise again from the shift register Sir. Along with this again, the address counter AZ is provided, the signals of which arrive directly at the address temporary memory ASp1 or ASp2 or . . . ASpm appertaining to the individual memories S1–Sm. They are, however, only then passed on from the address temporary memory to the primary memory S1 or S2 or . . . Sm, if at the timing pulse input of the address temporary memory concerned, the appertaining address signal CS is appended to the shift register Sir. The sampling time pulse, also in the case of the arrangement according to FIG. 4, is applied by way of a frequency divider 1:m at the address counter AZ, which is again designated as FT.

Therefore, in the case of the solution illustrated in FIG. 4, the time for writing of the PCM signal is delivered by the analog/digital transducer, as opposed to the time To available in the arrangement according to FIG. 1 and FIG. 3, is enlarged to m.To (whereby To = 1:2$f_m$). This is attained because for each of the m EAROM's, a temporary memory DA1 or DA2 or . . . Dm for the data to be received and a temporary memory SA1 or SA2 or . . . SAm for the address is preconnected. With the help of the CS signals from the shift register Sir, the addresses or data are then loaded into the temporary memories. At playback, the data recalled from the EAROM's are joined again by way of multiplexer circuits MP provided at the data outputs of the individual EAROM's S1, S2, S3, . . . Sm and are passed on to the digital/analog converter of the playback portion WT.

The individual multiplexers MP can consist of a number of MOS field effect transistors, the sources of which are connected to one of the data outputs each of the appertaining EAROM memories S1, S2, . . . Sm, and the drain of which is connected with a data input each of the digital/analog converter D/A in the playback portion WT. The gate electrodes of the field effect transistors appertaining each to one EAROM memory S1, S2, . . . Sm, therefore of the field effect transistors each of one of the multiplexers MP, are simultaneously connected by way of the address signals CS1 or CS2 or . . . CSm which is associated with the concerned EAROM memory and which is yielded by the shift register Sir, in such a manner that the digital/analog converter D/A is only then connected to the appertaining EAROM memory, when the addressing signal CS which is associated thereto is applied.

In the case of the arrangements illustrated in FIGS. 1–4, discrete amplitude values of the analog signal which arose because of the acoustic signal (thus, a PAM signal) were digitized and kept in binary form in one or more non-volatile semiconductor memories. To each discrete amplitude value n bits are associated. However, above, under b, the possibility is suggested that with the discrete amplitude values one can also apply an analog memory and can recall the analog signals again, as needed, and to utilize the same for restoration of the acoustic signal. The advantage of such a solution is that the number of the required analog memory locations is n times smaller than the number of necessary locations in the case a.

In the publication "Technology of a New n-Channel One-Transistor EAROM Cell Called SIMOS" by A. Scheibe and H. Schulte, of the IEEE Transactions on Electron Devices, Vol. ED-24, No. 5 (May 1977), pp. 600–610, non-volatile semiconductor memories are described of which the memory cells, consisting of a field effect transistor of the MOS type, are generated at the surface of a silicon crystal with a floating gate and a control gate, such that the floating gate is located precisely between the control gate and the n channel of the memory cells generated at the semiconductor surface. Both gates consist of doped polysilicon and are developed so that in lateral relationship the floating gate coincides precisely with the control gate. This is the so-called electrically programmable read only memory (EPROM) cell and the memory consisting of such cells is an EPROM memory.

If the control gate extending laterally beyond the flaoting gate is approached at the protruding portion in the same manner as the floating gate of the semiconductor surface, and therefore the control of the current channel occurs no longer exclusively under mediation of the floating gate, but rather partially also by the direct capacitive influence of the control gate, then one is provided with a non-volatile memory cell designated as the EAROM cell.

Figure 5:
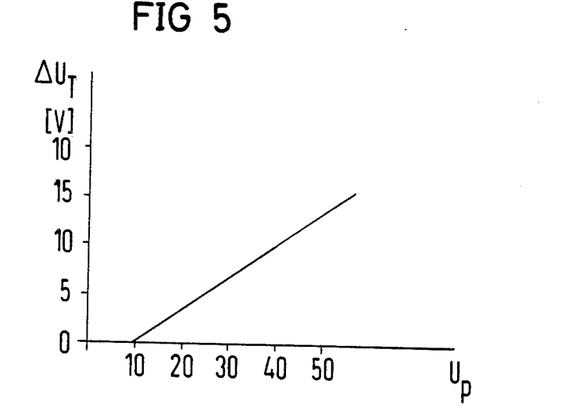
FIGS. 5-12 are graphic and schematic representations of particular forms of execution of the invention.

In the literature mentioned above, the connection between the value of the programming voltage $U_P$ at the control gate of the memory cell and the drift $\Delta U_T$ of the cutoff voltage of the transistor of the cell is stated. The corresponding diagram is illustrated in FIG. 5.

The procedure which can be applied from this diagram can now be utilized to use the SIMOS transistor as an analog memory. The programming voltage $U_P$ corresponds in this to the discrete amplitude value and the shift of the threshold voltage $U_T$ of the stored analog information. During the reading of the memory, the shift $\Delta U_T$ of the threshold voltage is determined and with this the discrete amplitude value is recovered.

Figure 6:
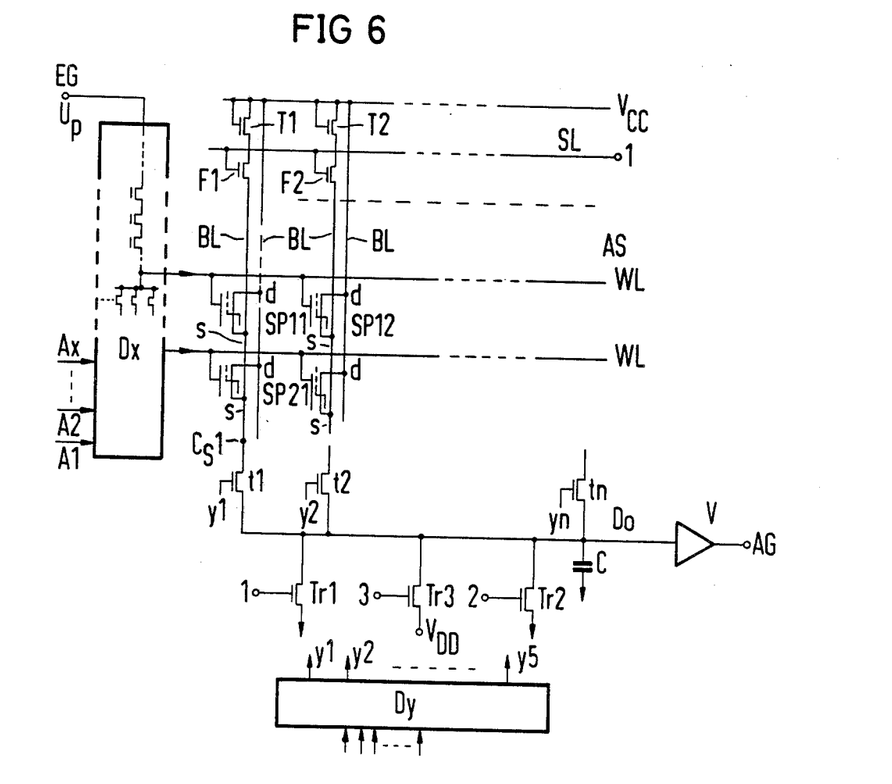

A corresponding realization of such a circuit is illustrated in FIG. 6. FIG. 6 illustrates the development of an analog memory AS constructed with transistor cells.

The individual memory cells SP11, SP12, . . . SP1n, SP21, SP22, . . . etc. are, are usual, generated at the surface of the silicon chip in the form of a matrix, and consists each of a SIMOS transistor having a control gate and a floating gate. The word lines WL which extend parallel to the matrix lines and which are associated each to an adjacent line of the memory cells SP.1, SP.2, . . . SP.n, lie at the control gate of all memory cells of the appertaining matrix lines and, in addition, at the associated signal output of a line selection decoder Dx (x decoders). The decoder Dx is, as illustrated in FIG. 6, constructed of n channel MOS field effect transistors of normal construction, in such a manner that the individual amplitude values to be stored, therefore the programming voltage $U_P$ of the analog signal, are placed each according to selection of the decoder Dx at one of the word lines WL of the SIMOS memory matrix AS. The selection of the decoder Sx proceeds by way of addressing signals A1, A2 . . . Ax and corresponding address inputs.

Parallel to the columns of the memory matrix AS, in each case one pair of bit lines BL, which is each associated to one column of the matrix AS, is provided. The one bit line serves to place the drains of the memory cells SP1, SP2, . . . SPn at the supply potential $V_{CC}$. The other bit line has the task of placing the source of the individual memory cells either at the potential $V_{DD}$ or at zero potential (ground).

To this end, the last-named bit line of the bit line pairs associated each to one of the matrix columns is placed, for one thing, in each case across one MOS field effect transistor T1 or T2 or . . . Tn, which is connected as a resistor and which serves as a load element, whereas, on the other hand, the supply with the third potential $V_{DD}$ or the zero potential occurs in each case across a further MOS field effect transistor t1 or t2, or . . . tn. Along with this, the drains of the last-named field effect transistors t1 or t2 . . . or tn are connected with the source regions of the memory cells appertaining to the matrix column concerned, therefore, with the end of the second bit line, whereas the drains of these transistors t1, t2, etc. lie jointly at the supply potential $V_{DD}$ or at zero potential.

The control of the field effect transistors t1, t2, . . . tn occurs by way of a column selection decoder Dy (y decoder), which is provided exclusively for the addressing according to columns, while the information $U_P$ to be stored in the exemplary case portrayed is given exclusively by way of the x decoder Dx in the word lines WL connected thereto.

For the purpose of the column addressing, the y decoder Dy is connected on the input side with the addressing signal, whereas, corresponding the construction of the decoder, the information for the adjustment of the field effect transistor t1, t2, tn to be conducted appear at the outputs y1, y2, yn, and is transferred to the gates thereof. For this purpose, the gate electrode of the transistor t1 is connected with the output y1, the gate electrode of the transistor t2 with the output y2, etc. The non-volatility of the information stored in the matrix AS is again provided by the presence of the floating gates, which are not specially designated, in the individual SIMOS memory cells.

A write line SL extending parallel serves the function 1, therefore the writing of the information to be stored, the write instructions directed by way of the input designated according to the function arrive at the control electrodes of MOS field effect transistors F1, F2, . . . Fn, which lie each in series to the load elements T1, T2, . . . Tn and together with these are connected to the first supply potential $V_{CC}$ and besides, by way of the second bit line BL of each of the provided bit line pairs are connected to the source region of the individual memory cells of the individual matrix columns. If the transistors F1, F2, . . . Fn are directive, then the full voltage provided by the difference of the two supply potentials lies between the source and drain of all the memory cells SP1, SP2 . . . SPn of the specific matrix column.

The source region of the MOS transistors t1, t2, . . . tn admitted by the y decoder Dy lie at a common data line Da, which leads across an amplifier V to the data output AG, whereas the data input EG of the memory, as has already been noted, lies at the x decoder Dx. Further, the data output Da is applied by way of three MOS field effect transistors Tr1, Tr2 and Tr3 as well as a capacitor C at the second supply potential $V_{DD}$ or zero potential or a third supply potential. The first transistor Tr1 has the task, together with the right line SL and the MOS transistor F1, F2, . . . Fn, of making possible the programming of the memory AS. For this reason, the control input of the transistor Tr1 is designated with the function 1. The second transistor Tr2 is for the second function, thus the function of reading, and as a result of this is designated at its signal input with the reference 2. The last of these transistors, the transistor Tr3, serves the third function, thus the function of the erasure of the stored information, which is indicated by the 3 at its control input.

For the purpose of writing of new analog information in the case of the analog memory AS illustrated in FIG. 6, one proceeds according to the following discussion.

Across the x decoder Dx, the programming voltage $U_P$ bearing the information proceeds to the control gates of the individual, in each case representing a memory cell SP, SIMOS transistors. The drain regions d of the memory cells are connected with the potential $V_{CC}$, and the source regions s are connected by way of a multiplexer, thus to the system of the transistors t1, t2, . . . tn, which is controlled by the decoder Dy, at the output line Da.

Mode 1

In order to write, in each case a column of the supply region s is connected by way of a corresponding transistor t1, t2, . . . tn of the multiplexer and the transistors Tr1 at ground, thus at zero potential. So that the columns of the matrix AS of the supply line capacity $C_s$ can be reprogrammed, the source regions s are connected during the writing operation by way of the load elements T1 or T2 or . . . Tn with the supply potential $V_{CC}$.

Mode 3

In erasing of the stored information, the third supply potential of about 35 V is applied by way of the transistor Tr3 at the source area s of the memory cells.

Mode 2

If the memory is read, thus in the case of the second mode, then the signal $U_P$ has a constant voltage, for example, 10 V, which is applied by way of the decoder Dx to the selected word line WL. The data line Da was briefly deloaded by way of the transistor Tr2, and is now loaded by way of a selected memory cell SP to a voltage of 10 V, reduced by the voltage $U_T$. Since the voltage $U_T$ corresponds to the analog information, with this the direct amplitude value is regained.

Figure 7:
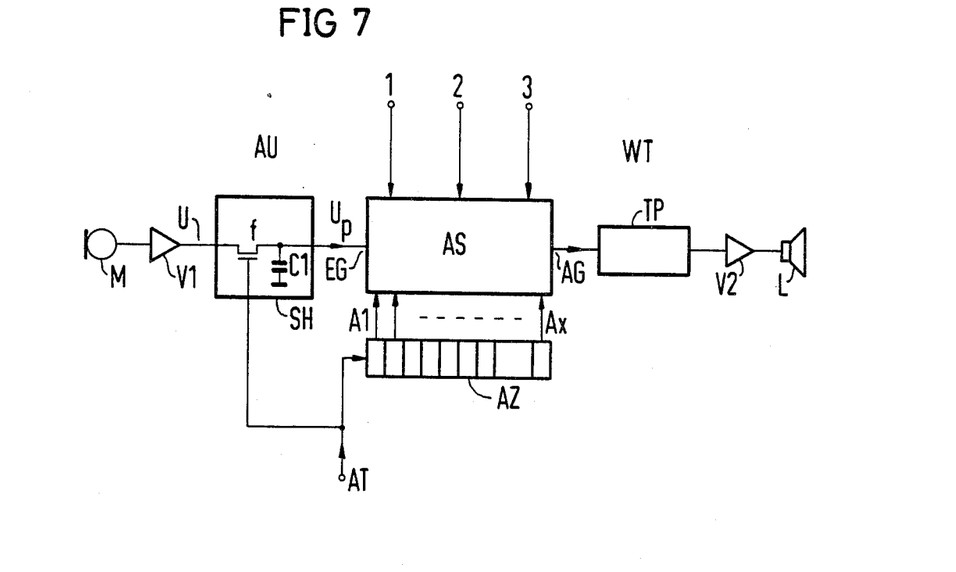

By employing an analog memory AS of the type illustrated in FIG. 6, a device may be constructed, according to the present invention, in the manner set forth in FIG. 7 in which a microphone M and a preamplifier V1 are operable to produce an electrical signal, the time progression and amplitude relationships of which correspond to the acoustic signal to be stored. The analog values to be stored are placed at the data input, thus the x-decoder of the analog memory AS, by way of a so-called sample and hold circuit SH, which delivers an output signal $U_P$ for storage. In a manner similar to that of the memory S, in the case of an arrangement according to FIG. 1, also the analog memory AS is controlled by an address counter AZ. The playback portion WT here consists solely of a low pass filter TP, which controls a loud speaker L by way of an output amplifier V2. The converter in the input portion AU here consists of the sample and hold circuit SH.

Figure 8:
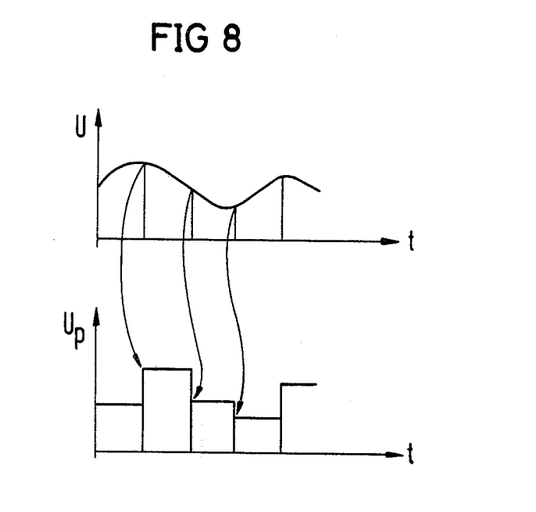

The sample and hold circuit SH is provided by the source-drain path of a MOS field effect transistor f, the gate of which is keyed by a sampling pulse AT. The sampling pulse AT also serve as the timing pulse supply of the address counter AZ, and is therefore also required for playing back the stored signal. The output of the transistor f, thus its drain, is connected by way of a capacitor C1 to a second supply potential, here ground. The relevant voltage is, therefore the voltages at the input and at the output of the sample of the hold circuit SH, are illustrated in both diagrams of FIG. 8, whereby the upper diagram illustrates the waveform of the voltage U appearing at the input, and the lower diagram illustrates the waveform of the programming voltage $U_P$. The time t serves as an abscissa.

Figure 9:
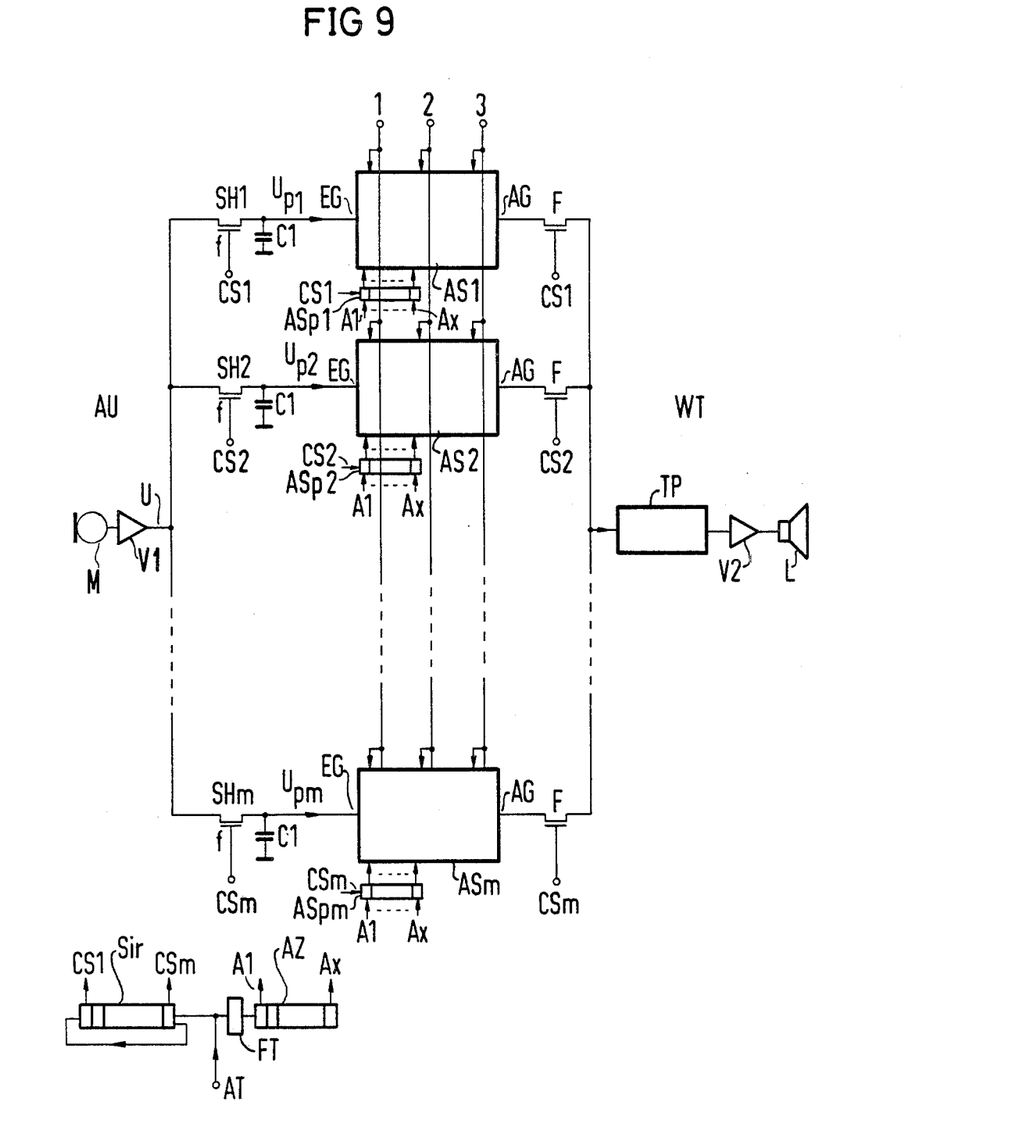

In FIG. 9, an embodiment is illustrated, which corresponds to the digital embodiment of FIG. 4. Here again, several memories which are the same, this time analog memories AS1 . . . ASm, are connected in parallel to one another at the input amplifier V1 of the input portion AU and the low pass filter TP in the playback portion WT, so that one again has available, analogous to the arrangement of FIGS. 3 and 4, a time span for writing which is enlarged by the factor m.

In FIG. 9, the address temporary memories ASp1, ASp2 . . . ASpm are carried over from FIG. 4, whereas the data synchronizers (data temporary memories) have been replaced by respective sample and hold circuits SH1, SH2, . . . SHm, which are constructed in the manner illustrated in FIG. 7 so as to each comprise a MOS transistor f and a capacitor C1. As with the data synchronizers DA1, DA2, etc of FIG. 4, the sample and hold circuits are each activated by an assigned signal CS1, CS2 . . . CSm by means of a shift register Sir which is controlled by the sampling pulse AT, so as to be connected at the output of the amplifier V1 or, in the absence of the appropriate selection signal CS are disconnected from the output amplifier V2, so that the analog memory AS1, AS2 . . . ASm appropriate in each case is connected or disconnected with respect to the analog signal which corresponds to the acoustic signal.

The selection signals CS1, CS2, . . . CSm, which are generated by the shift register Sir, are applied at the control inputs of the address temporary memories ASp1, ASp2 . . . ASpm, to which the associated selection signal is applied to activate the appertaining analog memories AS1, AS2, AS3 . . . ASm by way of the interposed sample and hold circuits SH1, SH2, . . . SHm. As a result of this, the address signals A1, A2, . . . Ax which are emitted by the address counter AZ arrive only at that one of the analog memories which, including its address temporary memory, is activated by the selection signal appropriate in each case.

The selection signals CS1, CS2, . . . CSm generated by the shift register Sir are also connected at the gate of respective field effect transistors F, associated with the data output AG of the individual analog memory, which transistor connects the memory portion AS1, AS2 . . . ASm, selected in each case, to the output low pass filter TP or disconnects the memory therefrom.

Figure 10:
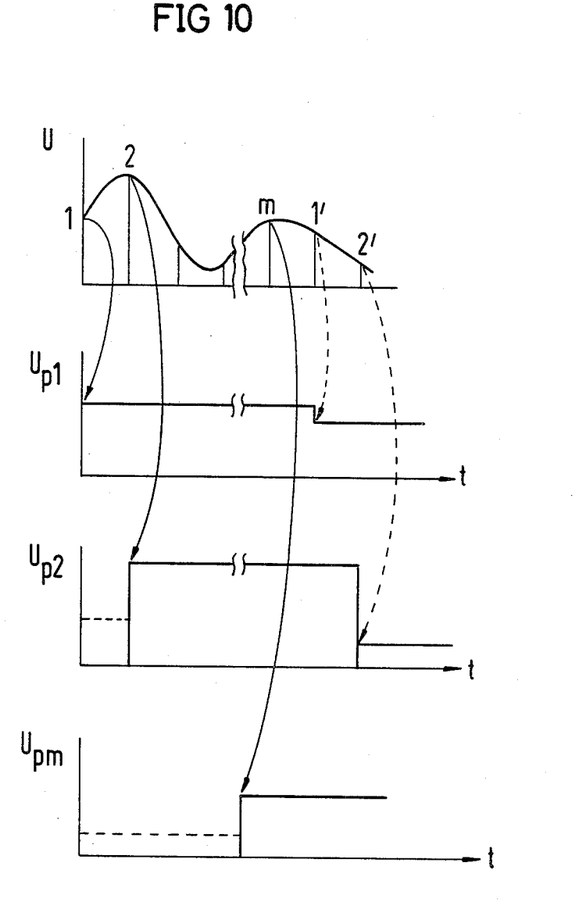

The voltage waveforms for the programming voltages $U_{p1}$, $U_{p2}$ . . . $U_{pm}$ which are fed to the individual analog memories AS1, AS2, . . . ASm, are illustrated in FIG. 10.

In the case of the previously-described exemplary embodiments, EAROM or SIMOS memories are employed. With these memories, the erasing of the stored information occurs by the production of a third voltage $V_{DD}$, which amounts to, for example, 35 V. There are memories, however, in the case of which the erasing is accomplished in a different manner, for example, by light incidence. Here, for example, the EPROM memories should be mentioned, the production of which is, in general, less expensive than for the EAROM and SIMOS memories. However, other programmable semiconductor memories can also be used, for example, ROM's or PROM's, by which the programming with the acoustic signal is accomplished, for example, at the manufacturer, who then only passes it on to the buyer with the memory combined with the playback portion WT.

In this case, the input portion AU remaining with the manufacturer, as well as the playback portion WT received by the buyer, can be equipped in each case with a semiconductor memory. With this, the programmable semiconductor memory which belongs to the input portion is used as a temporary memory for the information required for the playback of the acoustic signal, from which memory, then, at a given point in time, the information is transferred by the manufacturer to the memory of the playback portion, in order to remain in permanent storage. It is clear that under these relationships, the memory belonging to the playback portion WT does not absolutely have to be an EAROM memory.

Figure 11:
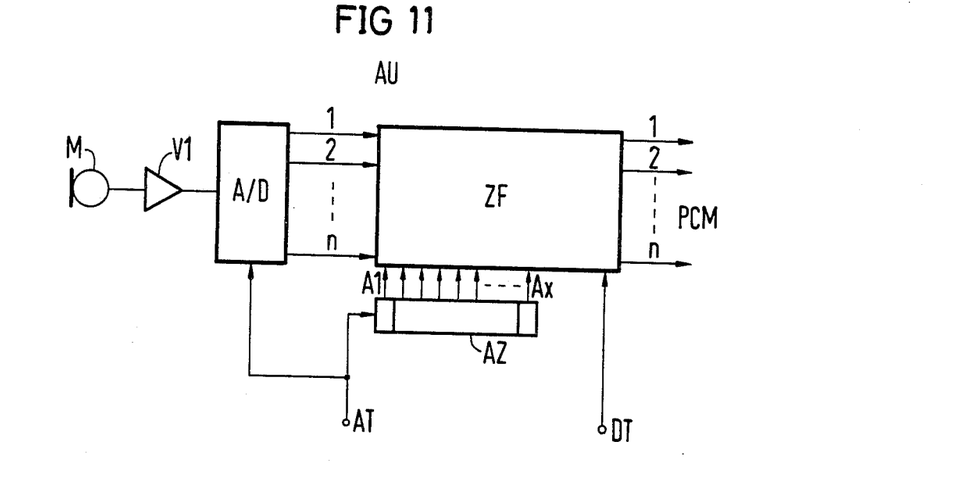
Figure 12:
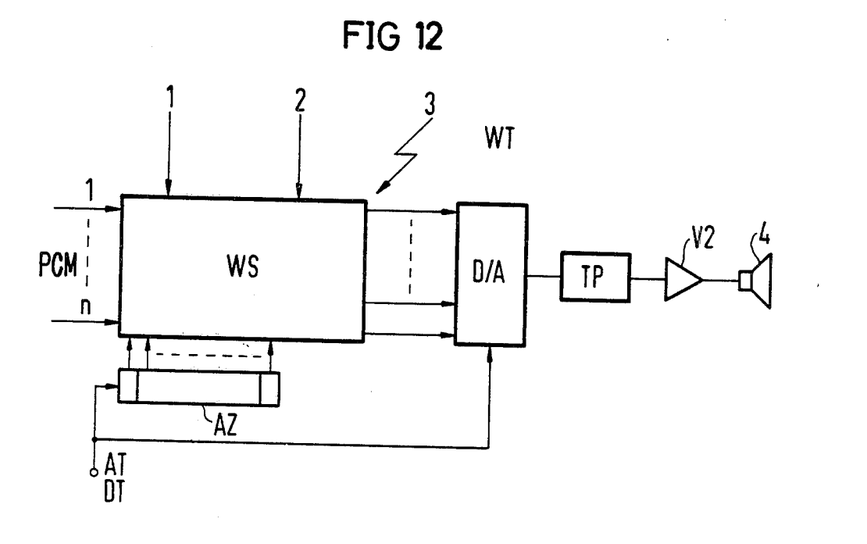

The above is illustrated in the embodiment of FIGS. 11 and 12, in which FIG. 11 illustrates the input portion AU and FIG. 12 illustrates the playback portion WT.

The receiving portion of FIG. 11 again comprises a microphone M with a preamplifier V1 and an analog/digital converter A/D which feed the digital signals obtained by the conversion to the inputs of a temporary memory ZF. The temporary memory can be, for example, an EAROM memory.

A sampling pulse AU, required for the operation of the arrangement, at the same time serves for entry of the address counter connected to the temporary memory ZF. For the case of an embodiment of a temporary memory ZF corresponding to FIG. 4, (the same being true for the structure of FIG. 9), the sampling pulse must be fed to the address counter AZ by way of a frequency divider with a division ratio of 1:m. The playback portion of FIG. 12 comprises the playback memory WS which is to be charged by the input portion AU via the temporary memory ZF, and which must be programmed only once, that is by the manufacturer. For this case, one can also use less expensive ROM memories for the memory WS in the playback portion, in particular when only a single programming is intended, that is, that always only the same acoustic signal is to be played back.

For the case in which the playback memory WS is also to be repeatedly programmed, the use of an EPROM memory is recommended as a playback memory, since such a memory is also less expensive to produce than an EAROM memory, and in addition, the third operational mode, that is erasing of the stored information, is possible by optical means. For the remainder, the playback portion WT is equipped with a digital/analog converter D/A, a low pass filter TP, an output amplifier V2 and a loud speaker L.

Since the writing speed of present EPROM's, similar to the EAROM's, is often less than required by the sampling pulse, the input portion AU portrayed in FIG. 11 at the temporary memories ZF is provided with a data output time pulse DT. This time pulse DT can have a significantly lower frequency than that of the sampling pulse AT, whereby the data output from the temporary memory ZF can be accommodated to the writing speed of the memory WS in the playback device WT of FIG. 12. In the playback device WT of FIG. 12, along with this, the address counter AZ can be operated during the reloading with the pulse frequency of the time pulse DT, and during reading with the frequency of the sampling pulse AT.

The input or conversion device AU according to FIG. 11, as well as the playback device WT according to FIG. 12 can be expanded in the sense of FIG. 3 or FIG. 4 by identical memories circuited in parallel with the temporary memory ZF, as well as the EPROM memory WS. With this, understandably, one must provide that the code number of memory locations of the conversion device AU is equal to those in the playback device.

Attention is also invited that even in the case of systems working with analog memories according to FIG. 7, a sectionalization according to FIGS. 11 and 12 is possible. It is also understood that an acoustic information stored in the conversion device AU can be used for loading of several playback devices.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. Apparatus for reproducing acoustic signals, comprising:
    a microphone for transducing an acoustic signal into an analog electrical signal;
    analog/digital converter means connected to said microphone and operable to convert the analog signals into a digital signal of discrete electrical pulses representing the information content of the acoustic signal;
    semiconductor read/write memory means connectible to said analog/digital converter means for storing the information manifest in the digital signal;
    digital/analog converter means connected to said read/write memory means and operable to convert the stored digital signal into an analog electrical signal which represents the original acoustic signal;
    an input amplifier interposed between said microphone and said analog/digital converter;
    a low pass filter connected to the output of said digital/analog converter means; and
    an output amplifier connected to the output of said low pass filter,
    wherein said memory means comprises an address counter including a timing pulse input, a plurality of parallel-connected non-volatile read/write memories each including a timing pulse input, each connected to said address counter, and each including a selection signal input, and means, including a timing pulse input, connected to said selection signal input and operable to generate selection signals for controlling the operation of said memories,
    said analog/digital converter means including a timing pulse input,
    said digital/analog converter means including a timing pulse input, and
    each of said timing pulse inputs of said address counter, said read/write memories, said analog/digital converter means, and said digital/analog converter means, connected to receive the same timing pulses.

2. The apparatus of claim 1, wherein said analog/digital converter means comprises:
    a digital/analog converter connected to said read/write memory means; and
    a low pass filter connected to the output of said digital/analog memory.

3. The apparatus of claim 2, wherein:
    said memory means comprises an address counter including a timing pulse input;
    said analog/digital converter means includes a timing pulse input;
    said digital/analog converter means includes a timing pulse input; and
    said timing pulse inputs are connected to receive the same timing pulses.

4. The apparatus of claim 1, wherein said memory means comprises an electrically alterable read only memory.

5. The apparatus of claim 4, wherein said electrically alterable read only memory comprises stacked-gate injection metal-oxide-semiconductor memory cells.

6. Apparatus for producing an acoustic signal, comprising:
    first transducer means for receiving and converting an acoustic signal into a corresponding analog electrical signal,
    second transducer means for receiving and converting an analog electrical signal into a corresponding acoustic signal,
    analog memory means connected between said first and second transducer means and operable to store said corresponding analog electrical signal and deliver said storage signal to said second transducer means for acoustic reproduction,
    said analog memory means comprising a memory constructed of stacked-gate injection metal-oxide semi-conductor memory cells, and
    said memory means comprising
    a matrix including said memory cells, a plurality of word lines and a plurality of first and second bit lines,
    each of said memory cells comprising a gate connected to a respective word line, a floating gate, a drain connected to a respective first bit line and a source connected to a respective second bit line,
    a plurality of load transistors each including a source-drain path connected in series with a respective second bit line and a first potential and a gate connected to said first potential, a write line for receiving a write signal, a plurality of write transistors each including a source-drain path connected in series with the source-drain path of a respective load transistor and a gate connected to said write line, an information output line, a write mode transistor, a read mode transistor and an erase mode transistor, each of said mode transistors including a gate for receiving a respective write, read and erase signal and a source-drain path connected between said information output line and respective second, third and fourth potential, a plurality of bit lines selection transistors each including a gate for receiving a bit selection signal and a source-drain path connected between a respective second bit line and said information output line, programming means for deriving a programming signal from said analog signal, an address generator operable to produce word line and bit line addresses, a bit line decoder connected between said address generator and said gates of said bit line selection transistors, and a word line decoder connected between said word lines and said address generator, said word line decoder including means connected to said programming means and operable to apply the programming signal to said gates of said memory cells which are connected to a selected word line.

7. The apparatus of claim 6, wherein said programming means comprises:

a sample and hold circuit connected between said first transducer means and said word line decoder.

8. The apparatus of claim 7, wherein said first transducer means comprises:

a microphone; and an amplifier connected between said microphone and said sample and hold circuit.

9. The apparatus of claim 8, wherein said sample and hold circuit and said address generator each include a timing pulse input for synchronous operation.

10. The apparatus of claim 9, wherein said sample and hold circuit comprises:

a field effect transistor including a gate connected to said timing pulse input, and a source-drain path connected between said first transducer means and said word line decoder; and a capacitor connected between said source-drain path and a reference potential.

* * * * *